(12) United States Patent
Doi et al.

(10) Patent No.: US 6,392,485 B1
(45) Date of Patent: May 21, 2002

(54) HIGH SLEW RATE DIFFERENTIAL AMPLIFIER CIRCUIT

(75) Inventors: Yasuyuki Doi, Nagaokakyo; Tetsuro Oomori, Hirakata, both of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/663,388

(22) Filed: Sep. 15, 2000

(30) Foreign Application Priority Data

Sep. 17, 1999 (JP) .......................................... 11-262821

(51) Int. Cl.[7] .................................................. H03F 3/45
(52) U.S. Cl. ........................ 330/253; 330/255; 330/257
(58) Field of Search ................................. 330/253, 255, 330/257

(56) References Cited

U.S. PATENT DOCUMENTS

| | | | |
|---|---|---|---|
| 4,881,045 A | 11/1989 | Dillman | 330/253 |
| 5,343,164 A | 8/1994 | Holmdahl | 330/253 |
| 5,477,189 A | 12/1995 | Vladimir et al. | 330/253 |
| 5,751,186 A | * 5/1998 | Nakao | 330/253 |
| 5,777,515 A | * 7/1998 | Kimura | 330/257 |
| 6,100,762 A | * 8/2000 | Kato | 330/255 |
| 6,225,866 B1 | * 5/2001 | Kubota et al. | 330/277 |

FOREIGN PATENT DOCUMENTS

| JP | 7-263978 | 10/1995 |
|---|---|---|
| JP | 9-116349 | 5/1997 |
| JP | 10-190375 | 7/1998 |

\* cited by examiner

Primary Examiner—Robert Pascal
Assistant Examiner—Khanh Van Nguyen
(74) Attorney, Agent, or Firm—Parkhurst & Wendel, L.L.P.

(57) ABSTRACT

It is an object of the present invention to provide a high slew rate differential amplifier circuit that can reduce current consumption while maintaining stability. A P-type MOS sub-current source (6) having a current source circuit including a transistor (M18) having a gate voltage of a P-type MOS output transistor (M15) input to a gate thereof and a constant current source transistor (M17) connected in series with the transistor (M18), the current source circuit being connected in parallel with a constant current source transistor (M1) of a P-type MOS differential input section (1) is combined with an N-type MOS sub-current source (7) including a current source circuit including a transistor (M19) having a gate voltage of an N-type MOS output transistor (M16) input to a gate thereof and a constant current source transistor (M20) connected in series with the transistor (M19), the current source circuit being connected in parallel with a constant current source transistor (M6) of an N-type MOS differential input section (2). To increase a current through the differential input section when a high slew rate is required, the current source circuit including the transistor having the gate voltage of the output transistor input to the gate thereof and the constant current source transistor connected in series with the first transistor is used as a sub-current source for a differential circuit, in order to reduce a steady-state current.

6 Claims, 6 Drawing Sheets

HIGH SLEW RATE DIFFERENTIAL AMPLIFIER CIRCUIT

FIELD OF THE INVENTION

The present invention relates to a differential amplifier circuit, and in particular, to a high slew rate differential amplifier circuit for use in a driver for a liquid crystal display device.

BACKGROUND OF THE INVENTION

Figure 3:
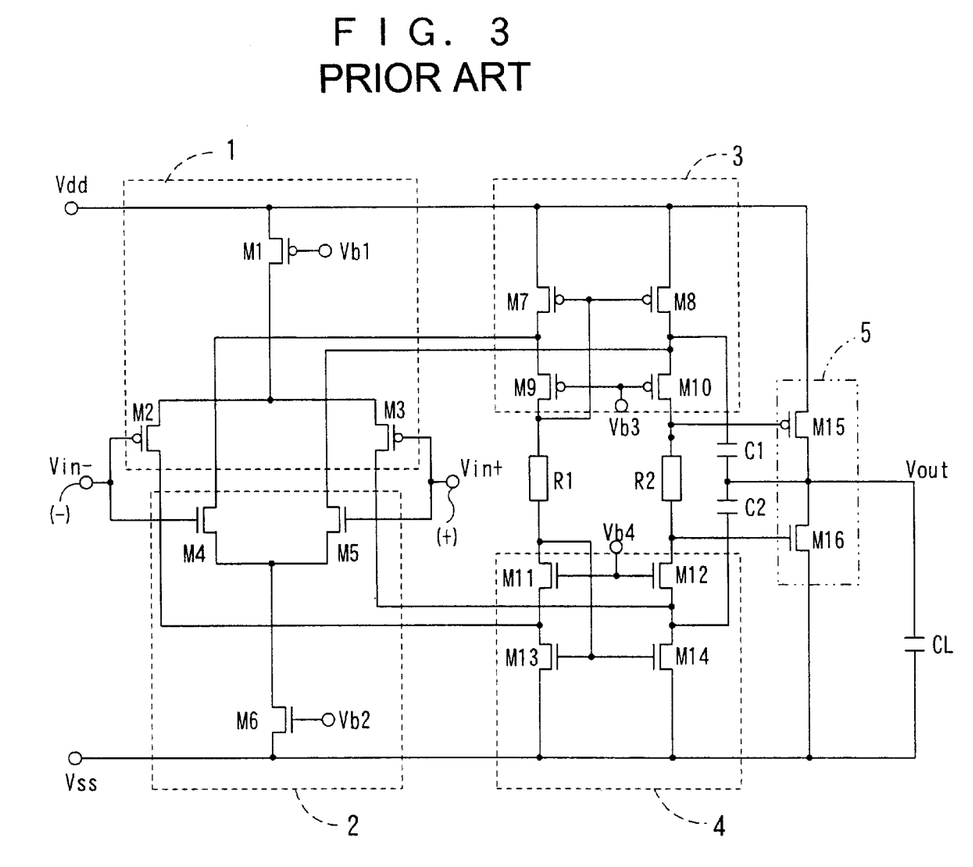
FIG. 3 is a circuit diagram of a conventional differential amplifier circuit.

A conventional rail-to-rail differential amplifier circuit is configured as shown in FIG. 3.

A main section of the circuit comprises a P-type MOS differential input section 1 composed of transistors M1, M2, and M3, N-type MOS differential input section 2 composed of transistors M4, M5, and M6, a current mirror circuit 3 composed of transistors M7, M8, M9, and M10, a current mirror circuit 4 composed of transistors M11, M12, M13, and M14, and a push pull output tier 5 composed of transistors M15 and M16, wherein reference Vdd denotes a positive power voltage and reference Vss denotes a negative power voltage.

A non-inverted input (+) is connected to gates of the transistors M3 and M5, while an inverted input (−) is connected to gates of the transistors M2 and M4. An output of the P-type MOS differential input section 1 from the transistors M2 and M3 is input to the current mirror circuit 4, while an output of the N-type MOS differential input section 2 from the transistors M4 and M5 is input to the current mirror circuit 3. The current mirror circuits 3 and 4 are connected together via resistors R1 and R2, a gate of a transistor M15 of the push pull output tier 5 is connected to a connection between the transistor M10 and one end of the resistor R2, while a gate of a transistor M16 of the push pull output tier 5 is connected to a connection between the transistor M12 and the other end of the resistor R2. Alternatively, the resistors R1 and R2 can be configured using MOS transistors.

References C1 and C2 denote phase compensating capacities, and references Vb1 to Vb4 denote bias voltages set to allow the corresponding transistors to operate appropriately. An external load CL is connected between the output of the push pull output tier 5 and the negative power voltage Vss.

A current flowing through the transistor M1 acting as a constant current source for the P-type MOS differential input section 1 is defined as Im1, whereas a current flowing through the transistor M6 acting as a constant current source for the N-type MOS differential input section 2 is defined as Im6. When a non-inverted input voltage (Vin+) and an inverted input voltage (Vin−) are equal, that is, in a steady state, currents flowing through the transistors M2 and M3 of the P-type MOS differential input section 1 are each (Im1)·(1/2), whereas currents flowing through the transistors M4 and M5 of the N-type MOS differential input section 2 are each (Im6)·(1/2).

When the steady state changes to a state where the non-inverted input (Vin+) is higher than the inverted input voltage (Vin−), most of the constant current (Im1) on the P-type MOS input side flows through the transistor M2 to increase a current flowing through the transistor M13. Thus, the current mirror circuit 4 increases currents flowing through the transistors M12 and M14 to reduce a gate voltage of the output transistor M16 to diminish a current flowing through the output transistor M16 as well as a lead-in current to an external load CL. A gate voltage of the output transistor M15 also decreases to increase a current flowing through the M15 to charge the external load CL. At this point, most of the constant current (Im6) on the N-type MOS input side flows through the transistor M5 to reduce a current flowing through the transistor M10 to lessen a gate voltage of the output transistor M15. Accordingly, the current flowing through the M15 increases to charge the external load CL to raise an output voltage Vout.

When the steady state changes to a state where the non-inverted input (Vin+) is lower than the inverted input voltage (Vin−), most of the constant current (Im1) on the P-type MOS input side flows through the transistor M3 to reduce the current flowing through the transistor M12. Thus, the gate voltage of the output transistor M16 rises to increase the current flowing through the output transistor M16 as well as the lead-in current to the external load CL.

At this point, most of the constant current (Im6) on the N-type MOS input side flows through the transistor M4 to increase a current flowing through the transistor M7. Thus, the current mirror circuit 3 increases currents flowing through the transistors M8 and M10 to raise a gate voltage of the output transistor M15 to diminish the current flowing through the output transistor M15 as well as a speed at which the external load CL is charged. Accordingly, the gate voltage of the output transistor M16 rises to increase the current flowing through the M16 as well as the lead-in current to the external load CL to lower the output voltage Vout.

DISCLOSURE OF THE INVENTION

Recent liquid crystal display devices for use in TVs or personal computer displays comprise larger screens with a higher resolution. Source drives are correspondingly required to have the capability of driving a larger load at a higher speed.

Figure 6:
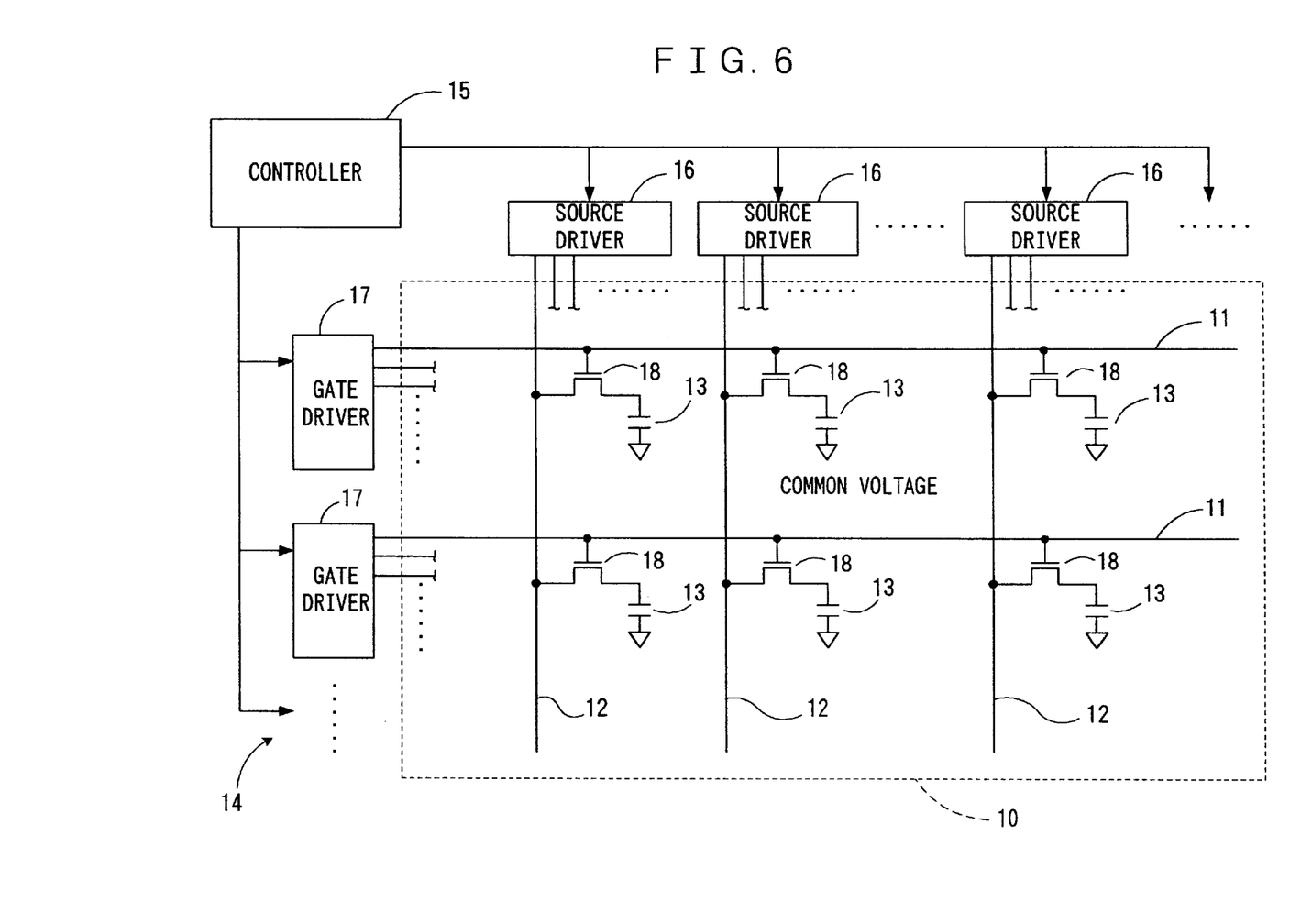
FIG. 6 is a block diagram of a general liquid crystal display device.

FIG. 6 schematically shows a liquid crystal display device.

A liquid crystal panel 10 comprises an active matrix liquid panel having a pixel 13 located at an intersection between each scanning line 11 and a corresponding data line 12 and a drive device for driving the liquid crystal panel. The drive device 14 comprises source drivers 16 controlled by a controller 15 and gate drivers 17.

The source driver 16 receives a signal from the controller 15 to drive the pixel 13, and the gate driver 17 switches a gate of a TFT (a thin film transistor) 18.

For example, an XGA (1,024×768) liquid crystal panel requires 1024×3 (R, G, B)=3,072 outputs, so that if the source driver has 384 outputs, 3,072/384=8 source driver chips are used.

One source driver chip with the 384 outputs has 384 differential amplifier circuits mounted thereon.

To accommodate a high-resolution liquid crystal panel with a UXGA (1,600×1,200) or a QXGA (2,048×1,536), a source driver with 480 or 516 outputs is required and in this case, one source driver 16 chip has 480 or 516 differential amplifier circuits mounted thereon.

Due to the larger screen and higher resolution of the liquid crystal panel 10, the source driver 16 is required to have the capability of driving a larger load at a higher speed while maintaining power consumption at a low level. Thus, the differential amplifier circuit mounted on the source driver 16 must be able to maintain current consumption at a low level and have a higher slew rate.

Furthermore, since the source driver 16 has a large number of differential amplifier circuits mounted thereon as described above, the slew rate must be improved by adding simple circuits having as small circuit area as possible so as not increase the chip area.

Since the source driver requires a large dynamic range, it often employs rail-to-rail amplifiers such as conventional differential amplifier circuits. The slew rate of such differential amplifier circuits for driving an external load is in proportion to a current value of a differential input section and is in inverse proportion to a capacity value of a phase compensating capacity. To improve the slew rate without adding slew rate improving circuits so as not to increase the circuit area, the currents Im1 and Im6 through the constant current source transistors M1 and M6 of the differential input section may be increased or phase compensating capacities C1 and C2 may be diminished.

A problem is, however, that an increase in the current through the differential input section increases the steady-state current and thus current consumption, while reduction of the phase compensating capacity degrades stability.

It is an object of the present invention to provide a high slew rate differential amplifier circuit that can maintain stability without increasing current consumption while eliminating the need to increase the circuit area.

A high slew rate differential amplifier circuit as set forth in a first arrangement of the present invention uses an output from a differential input section to drive an output tier via a current mirror circuit, and is characterized in that a current source circuit comprising a constant current source transistor and a transistor connected in series therewith and having a gate voltage of an output transistor of the output tier input to a gate thereof is connected in parallel with a constant current source transistor of the differential input section as a sub-current source. To increase a current through the differential input section when a high slew rate is required, the current source circuit comprising the transistor having the gate voltage of the output transistor input to the gate thereof and the constant current source transistor connected in series with the first transistor is used as a sub-current source for the differential circuit, in order to reduce the steady-state current.

A high slew rate differential amplifier circuit as set forth in a second arrangement of the invention comprises a P-type differential input section and an N-type differential input section each having the same non-inverted input terminal and inverted input terminal connected to an input thereof, an N-type current mirror circuit driven by an output from the P-type differential input section, a P-type current mirror circuit driven by an output from the N-type differential input section, and a push pull output tier driven having a P-type output transistor driven by an output from the P-type current mirror circuit and an N-type output transistor driven by an output from the N-type current mirror circuit, and is characterized in that the configuration of the present arrangement is implemented both in the P- and N-type differential input sections.

A high slew rate differential amplifier circuit as set forth in a third arrangement of the invention is characterized by comprising a P-type differential input section and an N-type differential input section each having the same non-inverted input terminal and inverted input terminal connected to an input thereof, an N-type current mirror circuit driven by an output from the Ptype differential input section, a P-type current mirror circuit driven by an output from the N-type differential input section, an output tier driven by an output from the N-type current mirror circuit and an output from the P-type current mirror circuit, and a sub-current source comprising a current source circuit including a constant current source transistor and a transistor connected in series therewith and having a gate voltage of the output tier input to a gate thereof, the current source circuit being connected to a constant current source transistor of the P- or N-type differential input section, in such a manner that an output from the current source circuit is inverted via current mirror circuits. To increase the current through the differential input section when a high slew rate is required, the current source circuit including the transistor having the gate voltage of the output transistor input to the gate thereof and the constant current source transistor is used as a sub-current source for the differential circuit in such a manner that the polarity of the current source circuit is inverted by the current mirror circuits, thereby reducing the steady-state current.

A high slew rate differential amplifier circuit as set forth in a fourth arrangement of the invention is characterized in that the configuration of the third arrangement is implemented both in the P- and N-type differential input sections.

A high slew rate differential amplifier circuit as set forth in a fifth arrangement of the invention is characterized by being configured by omitting the constant current source transistor from the sub-current source of the configuration of the first arrangement.

A high slew rate differential amplifier circuit as set forth in a sixth arrangement of the invention is characterized in that the configuration of the fifth arrangement is implemented both in the P- and N-type differential input sections.

A high slew rate differential amplifier circuit as set forth in a seventh arrangement of the invention is characterized by being configured by omitting the constant current source transistor from the sub-current source of the configuration of the third arrangement.

A high slew rate differential amplifier circuit as set forth in an eighth arrangement of the invention is characterized in that the configuration of the seventh arrangement is implemented both in the P- and N-type differential input sections.

A liquid crystal display device as set forth in a ninth arrangement of the invention is characterized by comprising an active matrix liquid panel having a pixel located at an intersection between each scanning line and a corresponding data line and a drive device for driving the liquid crystal panel, the drive device being configured by connecting an output from the output tier of the high slew rate differential amplifier circuit according to any one of arrangements one through eight to the data line.

DESCRIPTION OF THE EMBODIMENTS

Each embodiment of the present invention will be described below with reference to FIGS. 1 to 5.

Components in these figures which act in the same manner as those in FIG. 3, showing a conventional example, are denoted by the same reference numerals.

(Embodiment 1)

Figure 1:
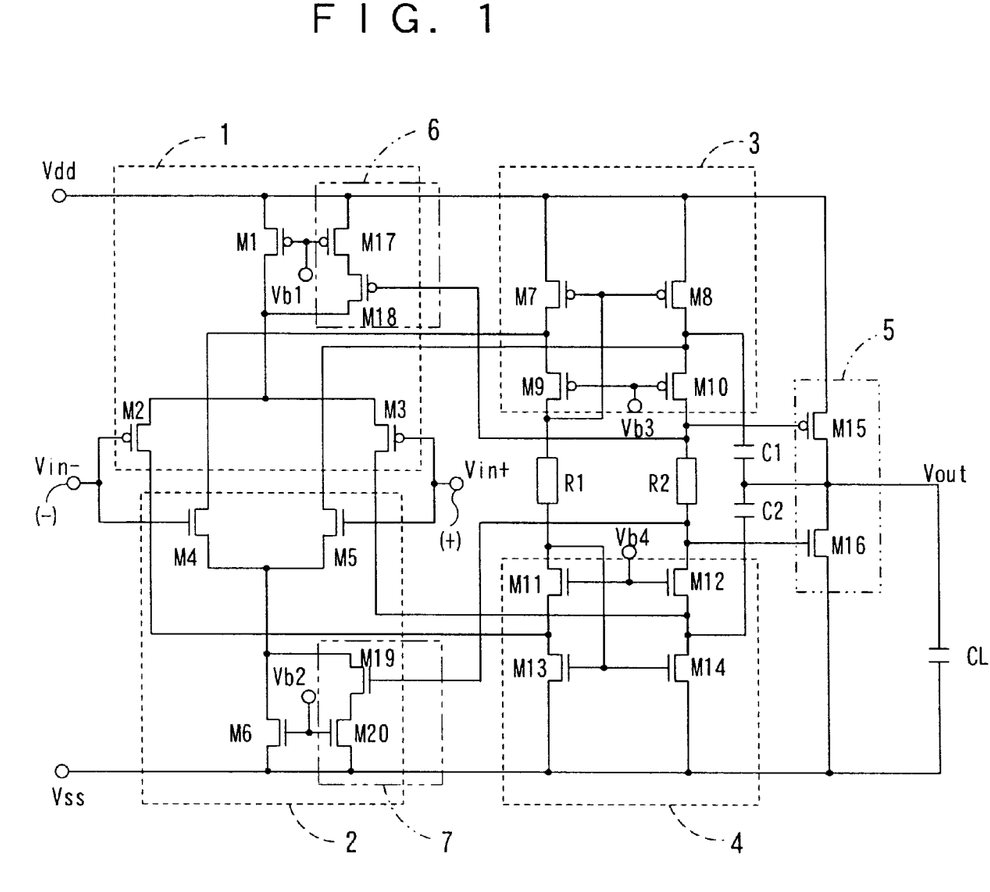
FIG. 1 is a circuit diagram of a differential amplifier circuit according to (Embodiment 1) of the present invention.

FIG. 1 shows (Embodiment 1) of the present invention, which differs from the circuit in FIG. 3, showing a conventional example, in that it additionally includes a P-type MOS sub-current source 6 composed of transistors M17 and M18 and an N-type MOS sub-current source 7 composed of transistors M19 and M20.

The P-type MOS sub-current source 6 is configured by connecting a current source circuit comprising the constant current source transistor M17 and the transistor M18 connected in series therewith and having the gate voltage of the P-type MOS output transistor M15 input to the gate thereof, in parallel with the constant current source transistor M1 of the P-type MOS differential input section 1.

The N-type MOS sub-current source 7 is configured by connecting a current source circuit comprising the constant current source transistor M20 and the transistor M19 connected in series therewith and having the gate voltage of the N-type MOS output transistor M16 input to the gate thereof, in parallel with the constant current source transistor M6 of the N-type MOS differential input section 2.

When the non-inverted input voltage (Vin+) and the inverted input voltage (Vin−) are equal, that is, in the steady state, the transistors M18 and M19 are cut off to allow no current to flow through the P- and N-type MOS sub-current sources 6 and 7. Thus, in the steady state, the currents flowing through the transistors M2 and M3 of the P-type MOS differential input section 1 are each (Im1)·(1/2), while the currents flowing through the transistors M4 and M5 of the N-type MOS differential input section 2 are each (Im6)·(1/2). The (Im1) and (Im6) each have a value smaller than those in the prior art.

When the steady state changes to a state where the (vin+) is higher than the (Vin−), most of the constant current (Im1) on the P-type MOS input side flows through the transistor M2 to increase the current flowing through the transistor M13. Thus, the current mirror circuit 4 increases currents flowing through the transistors M12 and M14 to reduce the gate voltage of the N-type MOS output transistor M16 to diminish the current flowing through the N-type MOS output transistor M16 as well as the lead-in current to the external load CL. The gate voltage of the P-type MOS output transistor M15 also decreases to increase the current flowing through the M15 to charge the external load CL. At this point, most of the constant current (Im6) on the N-type MOS input side flows through the transistor M5 to reduce the current flowing through the transistor M10 to lessen the gate voltage of the P-type MOS output transistor M15. Accordingly, the current flowing through the M15 increases to charge the external load CL to raise the output voltage Vout.

In this manner, the gate voltages of the output transistors M15 and M16 decline as in the conventional differential amplifier circuit and the transistor M19 thus remains cut off, so that the N-type MOS sub-current source 7 does not operate, while the transistor M18 is turned on to cause the P-type MOS sub-current source 6 to increase the current through the P-type MOS differential input section 1. Consequently, the current flowing through the transistor M2 increases to enhance the current flowing through the transistor M13; the current mirror circuit 4 increases the latter current above the currents flowing through the transistors M12 and M14. As a result, the gate voltages of the output transistors M15 and M16 rise faster than in the prior circuit to further increase the current flowing through the output transistor M15 to rapidly charge the external load CL, thereby rapidly raising the output voltage Vout. Therefore, the slew rate is improved.

When the steady state changes to a state where the (Vin+) is lower than the (Vin−), most of the constant current (Im1) on the P-type MOS input side flows through the transistor M3 to reduce the current flowing through the transistor M12. Thus, the gate voltage of the output transistor M16 rises to increase the current flowing through the output transistor M16 as well as the lead-in current to the external load CL. At this point, most of the constant current (Im6) on the N-type MOS input side flows through the transistor M4 to increase the currents flowing through the transistors M7 and M9. Thus, the current mirror circuit 3 increases the currents flowing through the transistors M8 and M10 to raise the gate voltage of the output transistor M15 to diminish the current flowing through the output transistor M15 as well as the speed at which the external load CL is charged. Accordingly, the gate voltage of the output transistor M16 rises to increase the current flowing through the M16, thereby discharging the external load CL to lower the output voltage Vout.

In this manner, the gate voltages of the output transistors M15 and M16 rise as in the conventional differential amplifier circuit and the transistor M18 thus remains cut off, so that the P-type MOS sub-current source 6 does not operate, while the transistor M19 is turned on to cause the N-type MOS sub-current source 7 to increase the current through the N-type MOS differential input section 2. Consequently, the current flowing through the transistor M4 increases to enhance the current flowing through the transistor M7; the current mirror circuit 3 increases the latter current above the currents flowing through the transistors M8 and M10. As a result, the gate voltages of the output transistors M15 and M16 rise faster than in the prior circuit to further increase the current flowing through the output transistor M16 to rapidly discharge the external load CL, thereby rapidly lowering the output voltage Vout. Therefore, the slew rate is improved.

An example of a simulation result will be shown to confirm the effects of the invention.

A power voltage was 8.5 V, an external load was 50 kΩ+80 pF, and a voltage follower was constructed by connecting the output node Vout to the inverted input terminal and applying a negative feedback to the circuit. A step signal was input to the non-inverted input terminal Vin+, the signal changing from 0.1 to 8.4 V upon rising and from 8.4 to 0.1 V upon falling. The amount of time from a change in input signal until the output voltage Vout reached 90% of a target voltage was measured.

As compared with the conventional configuration shown in FIG. 3, which requires 4.8 µs before the input signal rises to the target voltage, the configuration of (Embodiment 1) shown in FIG. 1 requires 3.5 µs, indicating that the slew rate has been improved.

As compared with the conventional configuration shown in FIG. 3 which requires 4.7 µs before the input signal falls to the target voltage, the configuration of (Embodiment 1) shown in FIG. 1 requires 3.4 µs, indicating that the slew rate has been improved.

In this manner, the effect of implementation of the present invention in improving the slew rate has been confirmed both for the rising and falling of the input signal.

In addition, in (Embodiment 1), when the steady state changes to the state where the Vin+ is higher than the Vin−, the transistor M18 is turned on to actuate the PMOS sub-current source. However, a current flowing from the PMOS sub-current source can be limited to a value determined by a bias voltage input to the gate of the constant current source transistor M17, to restrict an increase in instantaneous current. Additionally, when the steady state changes to the state where the Vin+ is lower than the Vin−, the transistor M19 is turned on to actuate the NMOS sub-current source. However, a current flowing from the NMOS sub-current source can be limited to a value determined by a bias voltage input to the gate of the constant current source transistor M20, to restrict an increase in instantaneous current. This prevents variations in power voltage caused by the instantaneous current as frequently occur in a liquid crystal driving device having a large number of differential amplifiers simultaneously driving a load.

(Embodiments 1) has both the N-type MOS sub-current source 7 and the P-type MOS sub-current source 6, but the sub-current source may comprise only one of them.

(Embodiment 2)

Figure 2:
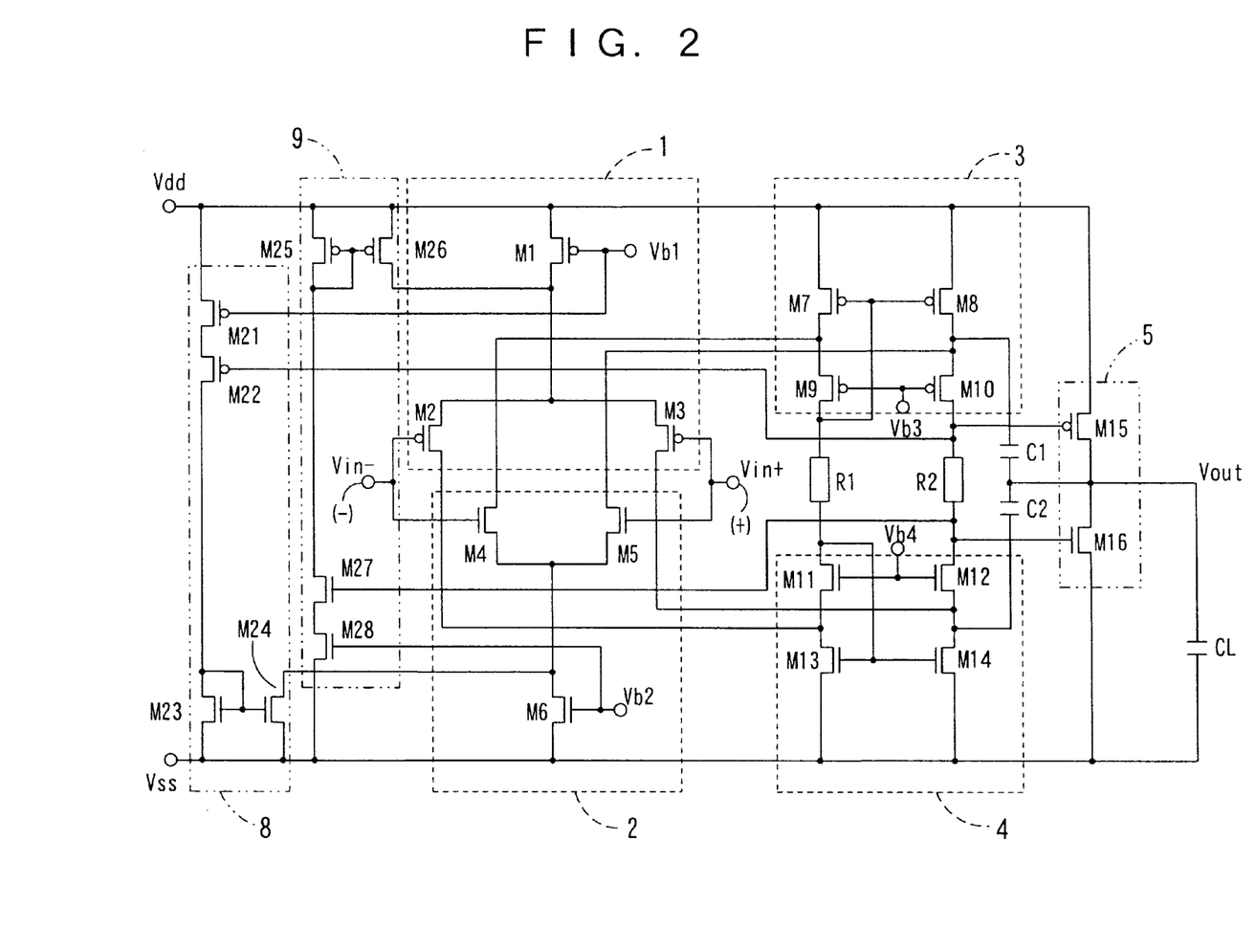
FIG. 2 is a circuit diagram of a differential amplifier circuit according to (Embodiment 2) of the present invention.

FIG. 2 shows (Embodiment 2) of the present invention, which differs from the circuit in FIG. 3, showing a conventional example, in that it additionally includes an N-type MOS sub-current source 8 composed of transistors M21, M22, M23, and M24 and a P-type MOS sub-current source 9 composed of transistors M25, M26, M27, and M28.

The N-type MOS sub-current source 8 is configured by connecting a current source circuit comprising the constant current source transistor M21 and the transistor M22 connected in series therewith and having the gate voltage of the P-type MOS output transistor M15 input to the gate thereof, in parallel with the constant current source transistor M6 of the N-type MOS differential input section 2 in such a manner that the polarity of the current source circuit is inverted by current mirror circuits.

The P-type MOS sub-current source 9 is configured by connecting a current source circuit comprising the constant current source transistor M28 and the transistor M27 connected in series therewith and having the gate voltage of the N-type MOS output transistor M16 input to the gate thereof, in parallel with the constant current source transistor M1 of the P-type MOS differential input section 1 in such a manner that the polarity of the current source circuit is inverted by current mirror circuits.

When the non-inverted input voltage (vin+) and the inverted input voltage (Vin−) are equal, that is, in the steady state, the transistors M22 and M27 are cut off to allow no current to flow through the N- and P-type MOS sub-current sources 8 and 9. Thus, in the steady state, the currents flowing through the transistors M2 and M3 of the P-type MOS differential input section 1 are each (Im1)·(1/2), while the currents flowing through the transistors M4 and M5 of the N-type MOS differential input section 2 are each (Im6)·(1/2). The (Im1) and (Im6) each have a value smaller than those in the prior art.

When the steady state changes to a state where the (Vin+) is higher than the (Vin−), the gate voltages of the output transistors M15 and M16 decline as in the conventional differential amplifier circuit. Thus, since the transistor M27 remains cut off, the P-type MOS sub-current source 9 does not operate, while the transistor M22 is turned on to cause the current through the constant current source transistor M21 to flow through the transistor M23, further causing the current to flow through the transistor M24 due to current mirroring. Accordingly, the N-type MOS sub-current source 8 increases the current through the N-type MOS differential input section 2 to enhance the current flowing through the transistor M5 to reduce the current flowing through the transistor M10 as well as the gate voltage of the output transistor M15. Consequently, the current flowing through the output transistor M15 increases compared to the prior art to rapidly charge the external load CL, thereby rapidly raising the output voltage Vout. Therefore, the slew rate is improved.

When the steady state changes to a state where the (Vin+) is lower than the (Vin−), the gate voltages of the output transistors M15 and M16 rise as in the conventional differential amplifier circuit. Thus, since the transistor M22 remains cut off, the N-type MOS sub-current source 8 does not operate, while the transistor M27 is turned on to cause the current through the constant current source transistor M28 to flow through the transistor M25, further causing the current to flow through the transistor M26 due to current mirroring. Accordingly, the P-type MOS sub-current source 9 increases the current through the P-type MOS differential input section 1 to enhance the current flowing through the transistor M3 to reduce the current flowing through the transistor M12 to further raise the gate voltage of the output transistor M16. Consequently, the current flowing through the output transistor M16 increases compared to the prior art to rapidly discharge the external load CL, thereby rapidly lowering the output voltage Vout. Therefore, the slew rate is improved.

An example of a simulation result will be shown to confirm the effects of the invention.

A power voltage was 8.5 V, an external load was 50 kΩ+80 pF, and a voltage follower was constructed by connecting the output node Vout to the inverted input terminal and applying a negative feedback to the circuit. A step signal was input to the non-inverted input terminal Vin+, the signal changing from 0.1 to 8.4 V upon rising and from 8.4 to 0.1 V upon falling. The amount of time from a change in input signal until the output voltage Vout reached 90% of a target voltage was measured.

As compared with the conventional configuration shown in FIG. 3, which requires 4.8 µs before the input signal rises to the target voltage, the configuration of (Embodiment 2) shown in FIG. 2 requires 3.4 µs, indicating that the slew rate has been improved.

As compared with the conventional configuration shown in FIG. 3, which requires 4.7 µs before the input signal falls to the target voltage, the configuration of (Embodiment 2) shown in FIG. 2 requires 3.3 µs, indicating that the slew rate has been improved.

In this manner, the effect of implementation of the present invention in improving the slew rate has been confirmed both for the rising and falling of the input signal.

(Embodiments 2) has both the N-type MOS sub-current source 8 and the P-type MOS sub-current source 9, but the sub-current source may comprise only one of them.

(Embodiment 3)

Figure 4:
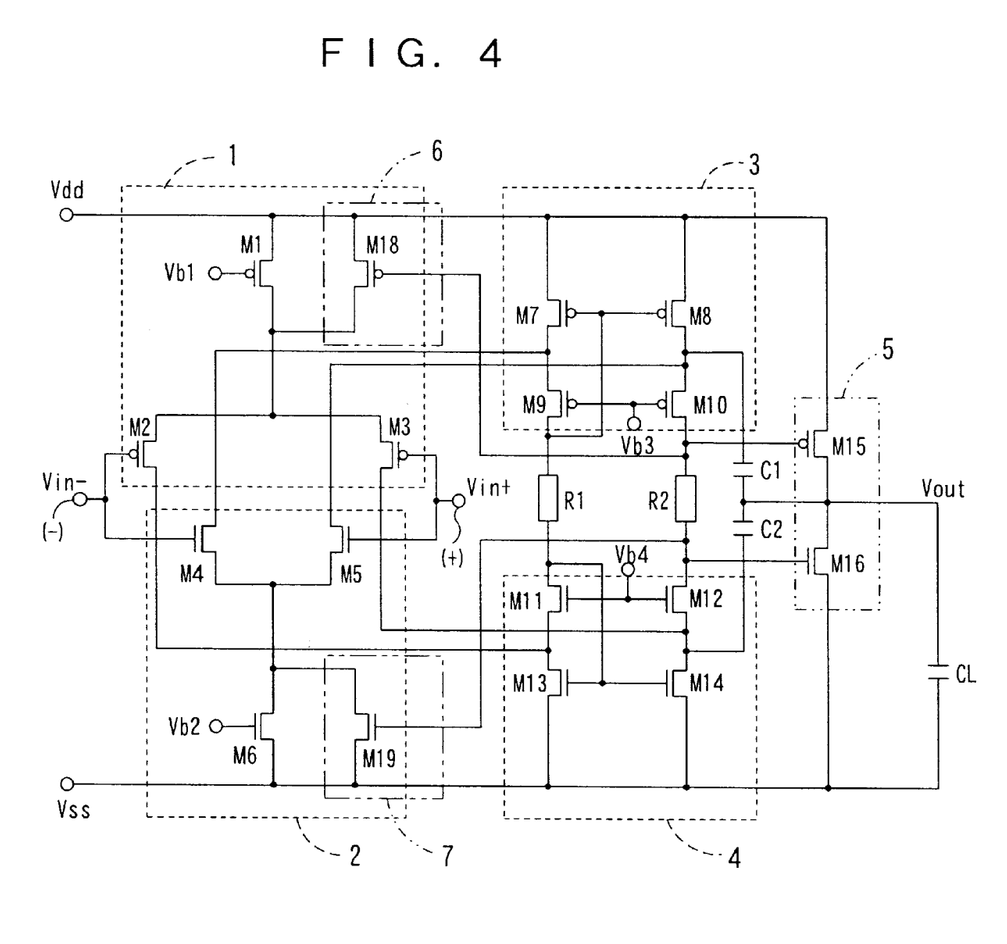
FIG. 4 is a circuit diagram of a differential amplifier circuit according to (Embodiment 3) of the present invention.

FIG. 4 shows (Embodiment 3) wherein the constant current source transistor M17 of the P-type MOS sub-current source 6 and the constant current source transistor M20 of the N-type MOS sub-current source 7 are omitted from (Embodiment 1).

That is, the current source circuit comprising the transistor M18 having the gate voltage of the transistor M15 of the output tier 5 input to the gate thereof is connected in parallel with the constant current source transistor M1 of the P-type MOS differential input section 1, while the current source circuit comprising the transistor M19 having the gate voltage of the transistor M16 of the output tier 5 input to the gate thereof is connected in parallel with the constant current source transistor M6 of the N-type MOS differential input section 2. The remaining part of the configuration is the same as in (Embodiment 1).

Even if a large number of differential amplifiers simultaneously drive a load as in a liquid crystal driving device, if a sufficient amount of power wiring is obtained to eliminate the needs for much attention to variations in power voltage, then the configuration of (Embodiment 3) can be employed to realize a high slew rate differential amplifier circuit that prevents an increase in circuit area compared to (Embodiment 1).

The operation is almost the same as that in (Embodiment 1), and different portions will thus be described.

When the steady state changes to a state where the (Vin+) is higher than the (Vin−), the transistor M18 is turned on to actuate the PMOS sub-current source. In (Embodiment 1), the current flowing from the PMOS sub-current source is limited to the value determined by the bias voltage input to the gate of the constant current source transistor M17, whereas in (Embodiment 3) the absence of the constant current source transistor M17 prevents the limitation of the current to increase the current flowing from the PMOS sub-current source above that in (Embodiment 1), thereby further improving the slew rate.

Alternatively, when the steady state changes to a state where the (Vin+) is lower than the (Vin−), the transistor M19 is turned on to actuate the NMOS sub-current source. In (Embodiment 1), the current flowing from the NMOS sub-current source is limited to the value determined by the bias voltage input to the gate of the constant current source transistor M20, whereas in (Embodiment 3), the absence of the constant current source transistor M20 prevents the limitation of the current to increase the current flowing from the NMOS sub-current source above that in (Embodiment 1), thereby further improving the slew rate.

An example of a simulation result will be shown to confirm the effects of the invention.

A power voltage was 8.5 V, an external load was 50 kΩ+80 pF, and a voltage follower was constructed by connecting the output node Vout to the inverted input terminal and applying a negative feedback to the circuit. A step signal was input to the non-inverted input terminal Vin+, the signal changing from 0.1 to 8.4 V upon rising and from 8.4 to 0.1 V upon falling. The amount of time from a change in input signal until the output voltage Vout reached 90% of a target voltage was measured.

As compared with the conventional configuration shown in FIG. 3, which requires 4.8 μs before the input signal rises to the target voltage, the configuration of (Embodiment 3) shown in FIG. 4 requires 2.1 μs, indicating that the slew rate has been improved.

As compared with the conventional configuration shown in FIG. 3, which requires 4.7 μs before the input signal falls to the target voltage, the configuration of (Embodiment 3) shown in FIG. 4 requires 1.9 μs, indicating that the slew rate has been improved.

In this manner, the effect of implementation of the present invention in improving the slew rate has been confirmed both for the rising and falling of the input signal.

(Embodiments 3) has both the N-type MOS sub-current source 7 and the P-type MOS sub-current source 6, but the sub-current source may comprise only one of them.

(Embodiment 4)

Figure 5:
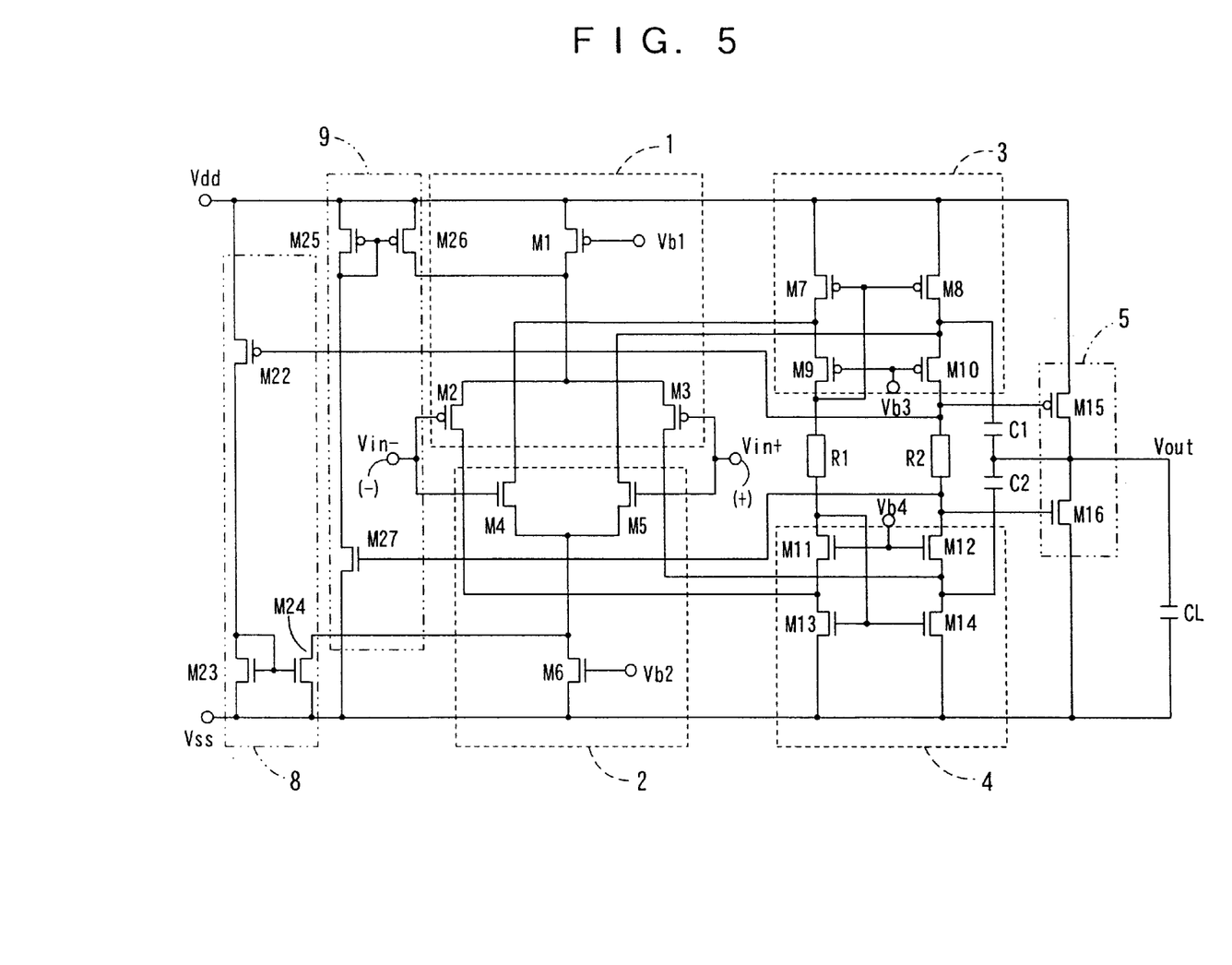
FIG. 5 is a circuit diagram of a differential amplifier circuit according to (Embodiment 4) of the present invention.

FIG. 5 shows (Embodiment 4) wherein the constant current source transistor M21 of the N-type MOS sub-current source 8 and the constant current source transistor M28 of the P-type MOS sub-current source 9 are omitted from (Embodiment 2).

That is, the N-type MOS sub-current source 8 is configured such that an output from the current source circuit comprising the transistor M22 having the gate voltage of the output transistor M15 of the output tier 5 input to the gate thereof has its polarity inverted by the current mirror circuit comprising the transistors M23 and M24, and this N-type MOS sub-current source 8 is connected in parallel with the constant current source transistor M6 of the N-type differential input section 2. The P-type MOS sub-current source 9 is configured such that an output from the current source circuit comprising the transistor M27 having the gate voltage of the output transistor M16 of the output tier 5 input to the gate thereof has its polarity inverted by the current mirror circuit comprising the transistors M25 and M26, and this P-type MOS sub-current source 9 is connected in parallel with the constant current source transistor M1 of the P-type differential input section 1. The remaining part of the configuration is the same as in (Embodiment 2).

Even if a large number of differential amplifiers simultaneously drive a load as in a liquid crystal driving device, if a sufficient amount of power wiring is obtained to eliminate the needs for much attention to variations in power voltage, then the configuration of (Embodiment 4) can be employed to realize a high slew rate differential amplifier circuit that prevents an increase in circuit area compared to (Embodiment 2).

The operation is almost the same as that in (Embodiment 2), and different portions will thus be described.

When the steady state changes to a state where the (Vin+) is higher than the (Vin−), the transistor M22 is turned on to actuate the NMOS sub-current source. In (Embodiment 2), the current flowing from the NMOS sub-current source is limited to the value determined by the bias voltage input to the gate of the constant current source transistor M21, whereas in (Embodiment 4), the absence of the constant current source transistor M21 prevents the limitation of the current to increase the current flowing from the NMOS sub-current source above that in (Embodiment 2), thereby further improving the slew rate.

Alternatively, when the steady state changes to a state where the (Vin+) is lower than the (Vin−), the transistor M27 is turned on to actuate the PMOS sub-current source. In (Embodiment 2), the current flowing from the PMOS sub-current source is limited to the value determined by the bias voltage input to the gate of the constant current source transistor M28, whereas in (Embodiment 4), the absence of the constant current source transistor M28 prevents the limitation of the current to increase the current flowing from the PMOS sub-current source above that in (Embodiment 2), thereby further improving the slew rate.

An example of a simulation result will be shown to confirm the effects of the invention.

A power voltage was 8.5 V, an external load was 50 kΩ+80 pF, and a voltage follower was constructed by connecting the output node Vout to the inverted input terminal and applying a negative feedback to the circuit. A step signal was input to the non-inverted input terminal Vin+, the signal changing from 0.1 to 8.4 V upon rising and from 8.4 to 0.1 V upon falling. The amount of time from a change in input signal until the output voltage Vout reached 90% of a target voltage was measured.

As compared with the conventional configuration shown in FIG. 3, which requires 4.8 μs before the input signal rises to the target voltage, the configuration of (Embodiment 4) shown in FIG. 5 requires 1.9 μs, indicating that the slew rate has been improved.

As compared with the conventional configuration shown in FIG. 3, which requires 4.7 μs before the input signal falls to the target voltage, the configuration of (Embodiment 4) shown in FIG. 5 requires 1.7 μs, indicating that the slew rate has been improved.

In this manner, the effect of implementation of the present invention in improving the slew rate has been confirmed both for the rising and falling of the input signal.

(Embodiments 4) has both the N-type MOS sub-current source 8 and the P-type MOS sub-current source 9, but the sub-current source may comprise only one of them.

An appropriate liquid crystal display device can be realized by connecting the output of the output tier 5 of any of (Embodiment 1) to (Embodiment 4) configured as described above, to the data line 12 of the liquid crystal panel 10 of the liquid crystal display device shown in FIG. 6.

As described above, according to the present invention, the sub-current source supplements the current through the differential input section when a high slew rate is required, thereby enabling the current from the constant current source of the differential input section to be set at a small value to eliminate the need to reduce the phase compensating capacity. Therefore, the current consumption of the differential amplifier circuit can be reduced to improve the slew rate while maintaining stability.

What is claimed is:

1. A differential amplifier circuit for using an output from a differential input section to drive an output tier via a current mirror circuit,
   wherein a current source circuit comprising a constant current source transistor and a transistor connected in series therewith and having a gate voltage of an output transistor of said output tier input to a gate thereof is connected in parallel with a constant current source transistor of said differential input section as a sub-current source.

2. A high slew rate differential amplifier circuit, comprising:
   a P-type differential input section and an N-type differential input section each having the same non-inverted input terminal (+) and inverted input terminal (−) connected to an input thereof;
   an N-type current mirror circuit driven by an output from said P-type differential input section;
   a P-type current mirror circuit driven by an output from said N-type differential input section;
   a push pull output tier having a P-type output transistor driven by an output from said P-type current mirror circuit and an N-type output transistor driven by an output from said N-type current mirror circuit;
   a first sub-current source in which a P-type constant current source transistor is connected in series with a P-type transistor having a gate voltage of said P-type output transistor input to a gate thereof and these transistors are connected in parallel with the constant current source transistor of said P-type differential input section; and
   a second sub-current source in which an N-type constant current source transistor is connected in series with an N-type transistor having a gate voltage of said N-type output transistor input to a gate thereof and these transistors are connected in parallel with a constant current source transistor of said N-type differential input section.

3. A high slew rate differential amplifier circuit comprising:
   a P-type differential input section and an N-type differential input section each having the same non-inverted input terminal (+) and inverted input terminal (−) connected to an input thereof;
   an N-type current mirror circuit driven by an output from said P-type differential input section;
   a P-type current mirror circuit driven by an output from said N-type differential input section;
   an output tier driven by an output from said N-type current mirror circuit and an output from said P-type current mirror circuit; and
   a sub-current source comprising a current source circuit including a constant current source transistor and a transistor connected in series therewith and having a gate voltage of said output tier input to a gate thereof, the current source circuit being connected to a constant current source transistor of said P-type differential input section or said N-type differential input section, in such a manner that the polarity of an output from the current source circuit is inverted via current mirror circuits.

4. A high slew rate differential amplifier circuit comprising:
   a P-type differential input section and an N-type differential input section each having the same non-inverted input terminal (+) and inverted input terminal (−) connected to an input thereof;
   an N-type current mirror circuit driven by an output from said P-type differential input section;
   a P-type current mirror circuit driven by an output from said N-type differential input section;
   a push pull output tier having a P-type output transistor driven by an output from said P-type current mirror circuit and an N-type output transistor driven by an output from said N-type current mirror circuit;
   a first sub-current source comprising a current source circuit including a P-type constant current source transistor and a P-type transistor connected in series therewith and having a gate voltage of said P-type output transistor input to a gate thereof, the current source circuit being connected in parallel with a constant current source transistor of said N-type differential input section, in such a manner that polarity of the current source circuit is inverted by current mirror circuits; and
   a second sub-current source comprising a current source circuit including an N-type constant current source transistor and an N-type transistor connected in series therewith and having a gate voltage of said N-type output transistor input to a gate thereof, the current source circuit being connected in parallel with a constant current source transistor of said P-type differential input section, in such a manner that polarity of the current source circuit is inverted by current mirror circuits.

5. A high slew rate differential amplifier circuit comprising:
   a P-type differential input section and an N-type differential input section each having the same non-inverted input terminal (+) and inverted input terminal (−) connected to an input thereof;

an N-type current mirror circuit driven by an output from said P-type differential input section;

a P-type current mirror circuit driven by an output from said N-type differential input section;

an output tier driven by an output from said N-type current mirror circuit and an output from said P-type current mirror circuit; and a sub-current source in which a current source circuit including a transistor having a gate voltage of said output tier input to a gate thereof is connected to a constant current source transistor of said P-type differential input section or said N-type differential input section in such a manner that the polarity of an output from the current source circuit is inverted via current mirror circuits.

6. A high slew rate differential amplifier circuit, comprising:

a P-type differential input section and an N-type differential input section each having the same non-inverted input terminal (+) and inverted input terminal (−) connected to an input thereof;

an N-type current mirror circuit driven by an output from said P-type differential input section;

a P-type current mirror circuit driven by an output from said N-type differential input section;

a push pull output tier having a P-type output transistor driven by an output from said P-type current mirror circuit and an N-type output transistor driven by an output from said N-type current mirror circuit;

a first sub-current source in which a current source circuit including a P-type transistor having a gate voltage of said P-type output transistor input to a gate thereof is connected in parallel with a constant current source transistor of said N-type differential input section in such a manner that polarity of the current source circuit is inverted by current mirror circuits; and a second sub-current source in which a current source circuit including an N-type transistor having a gate voltage of said N-type output transistor input to a gate thereof is connected in parallel with a constant current source transistor of said P-type differential input section in such a manner that polarity of the current source circuit is inverted by current mirror circuits.

* * * * *